United States Patent
Bolognia et al.

(10) Patent No.: US 6,556,438 B1
(45) Date of Patent: Apr. 29, 2003

(54) DENSE PACKAGING AND COOLING SYSTEM FOR USE WITH A SERVER OR OTHER PROCESSOR-BASED DEVICE

(75) Inventors: David F. Bolognia, Spring, TX (US); Gregory L. Gibson, Houston, TX (US); John R. Grady, Houston, TX (US)

(73) Assignee: Compaq Information Technologies Group LLP, Houston, TX (US)

(*) Notice: Subject to any disclaimer, the term of this patent is extended or adjusted under 35 U.S.C. 154(b) by 51 days.

(21) Appl. No.: 09/691,535

(22) Filed: Oct. 18, 2000

(51) Int. Cl.[7] .................................................. G06F 1/16
(52) U.S. Cl. ..................... 361/687; 361/683; 361/686; 62/259.1; 454/184
(58) Field of Search ..................... 361/679, 683–688, 361/690–697, 717, 718, 722; 62/259.1, 259.2, 404; 454/184

(56) References Cited

U.S. PATENT DOCUMENTS 5,414,591 A * 5/1995 Kimura et al. ............... 361/695
5,860,291 A * 1/1999 Johnson et al. ............. 62/259.2
6,058,011 A * 5/2000 Hardt et al. ................. 361/694
6,315,655 B1 * 11/2001 McEwan ..................... 454/184

* cited by examiner

Primary Examiner—Darren Schuberg
Assistant Examiner—Yean-Hsi Chang
(74) Attorney, Agent, or Firm—Fletcher, Yoder & Van Someren

(57) ABSTRACT

A densely packaged processor-based device, such as a server. The server includes a server chassis divided into two different cooling zones, a first pressure zone and a second pressure zone. A high output fan directs air across tightly packaged, heat producing components disposed in the higher pressure zone. The higher pressure permits sufficient airflow to adequately cool the components. This zone is separated from the second zone by a baffle to prevent the high pressure air from interfering with the cooling of components in the lower pressure zone.

16 Claims, 13 Drawing Sheets

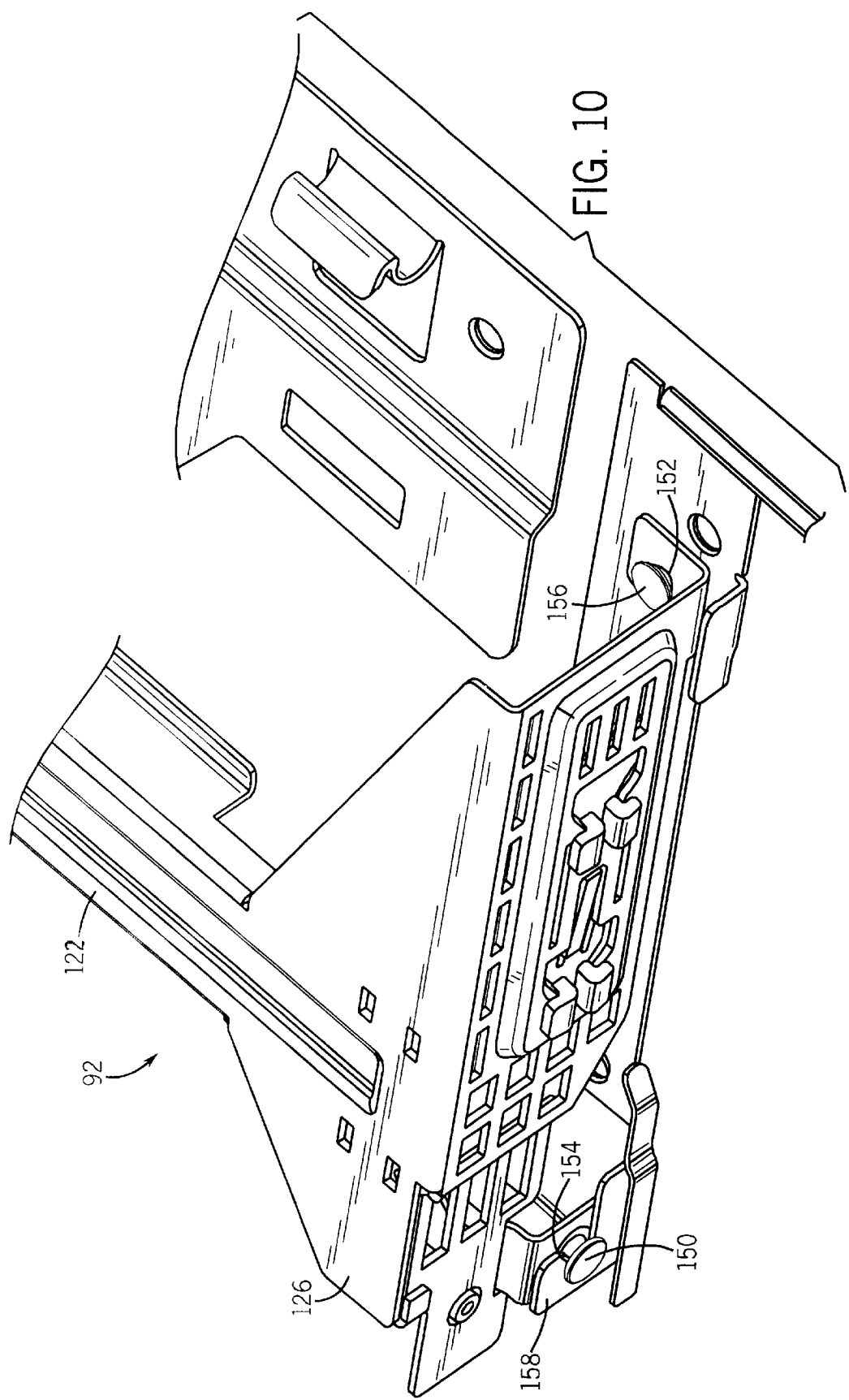

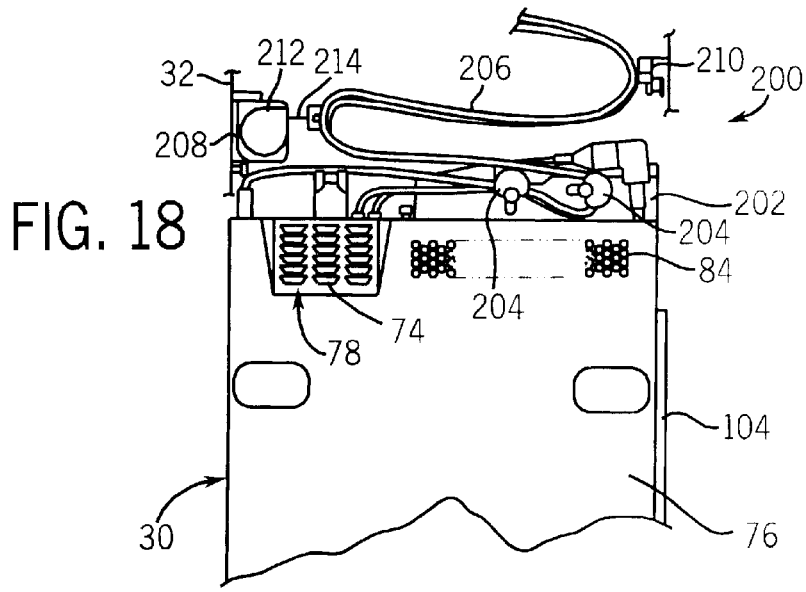
FIG. 18
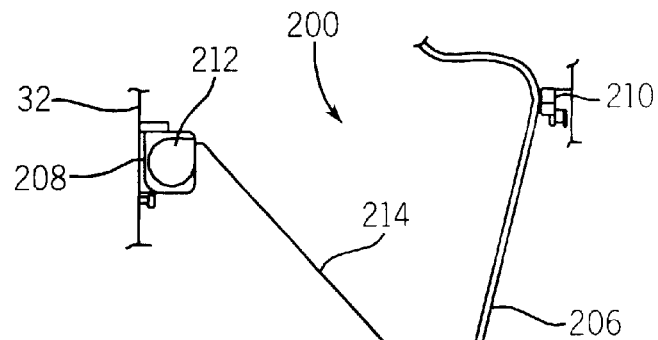
FIG. 19
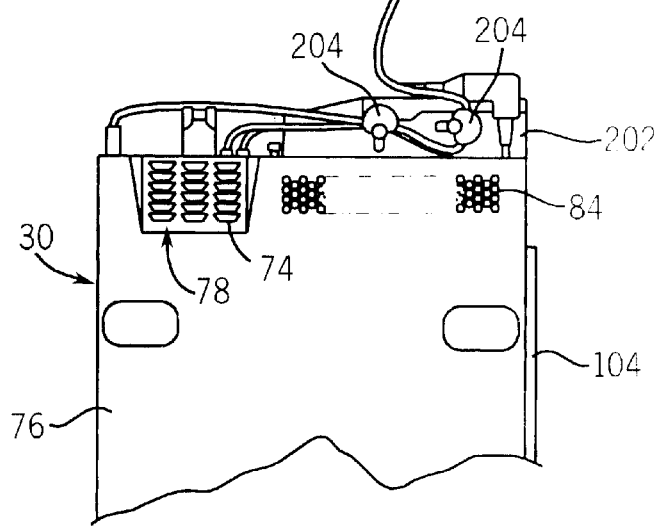

US 6,556,438 B1

DENSE PACKAGING AND COOLING SYSTEM FOR USE WITH A SERVER OR OTHER PROCESSOR-BASED DEVICE

FIELD OF THE INVENTION

The present invention relates generally to a packaging and cooling system, and particularly to a dense packaging and cooling system for use with a server or other processor-based device in which substantial heat is generated.

BACKGROUND OF THE INVENTION

The design of a compact chassis for processor-based devices while retaining a variety of desired features has been challenging. This is particularly true in the server industry where space constraints and the utilization of rack mounted units has made it desirable to design servers with a low profile. A low profile server permits the stacking of a greater number of servers in a mounting rack.

However, as the height of such devices has decreased, a variety of desirable features, e.g. hot plug drives, additional full length PCI cards, combined floppy drives and CD drives, have been omitted due largely to cooling constraints. Even if the components can be densely packed within a low profile chassis, the heat generated has been difficult to remove. Conventional designs utilize a series of small, centrifugal fans, but the designs have been inadequate for sufficient heat removal.

It would be advantageous to have a dense packaging design with adequate cooling capability that could be utilized with processor-based devices, such as servers.

SUMMARY OF THE INVENTION

According to one aspect of the present invention, a server is provided that is designed to facilitate cooling of internal components. The server includes a chassis divided into a first pressure zone and a second pressure zone. A first cooling fan is disposed to direct airflow through the first pressure zone. A second cooling fan is disposed to direct airflow through the second pressure zone. During operation of the fans, the first pressure zone is maintained at a higher pressure than the second pressure zone to provide sufficient airflow through densely packed, heat producing components without detrimentally affecting the airflow through the second pressure zone.

According to another aspect of the present invention, a processor-based device is designed to accommodate dense packaging of components. The design includes a chassis having a cooling zone. A cover is disposed over of the chassis to enclose the cooling zone. Additionally, a plurality of heat generating components are disposed in the cooling zone, and a fan is positioned to direct an airflow past the plurality of heat generating components. A baffle is oriented to prevent airflow from the cooling zone to other regions of the chassis.

According to another aspect of the present invention, a method is provided for creating greater cooling in a densely packed processor-based device. The method includes locating a plurality of heat producing components within a high pressure zone of a chassis. The method further includes separating the high pressure zone from a lower pressure zone of the chassis. An airflow is created at a pressure within the high pressure zone to maintain sufficient airflow past the plurality of components. This airflow is exhausted from the high pressure zone without detrimentally affecting the lower pressure zone.

BRIEF DESCRIPTION OF THE DRAWINGS

The invention will hereafter be described with reference to the accompanying drawings, wherein like reference numerals denote like elements, and:

FIG. 10 is a perspective view of the right end of the riser assembly illustrated in FIG. 7;

FIG. 18 is a top view of a cable management system deployed with an exemplary server that is retracted in a rack;

FIG. 19 is a top view of the cable management system illustrated in FIG. 18 with the exemplary server extended from the rack;

DETAILED DESCRIPTION OF THE PREFERRED EMBODIMENTS

Figure 1:
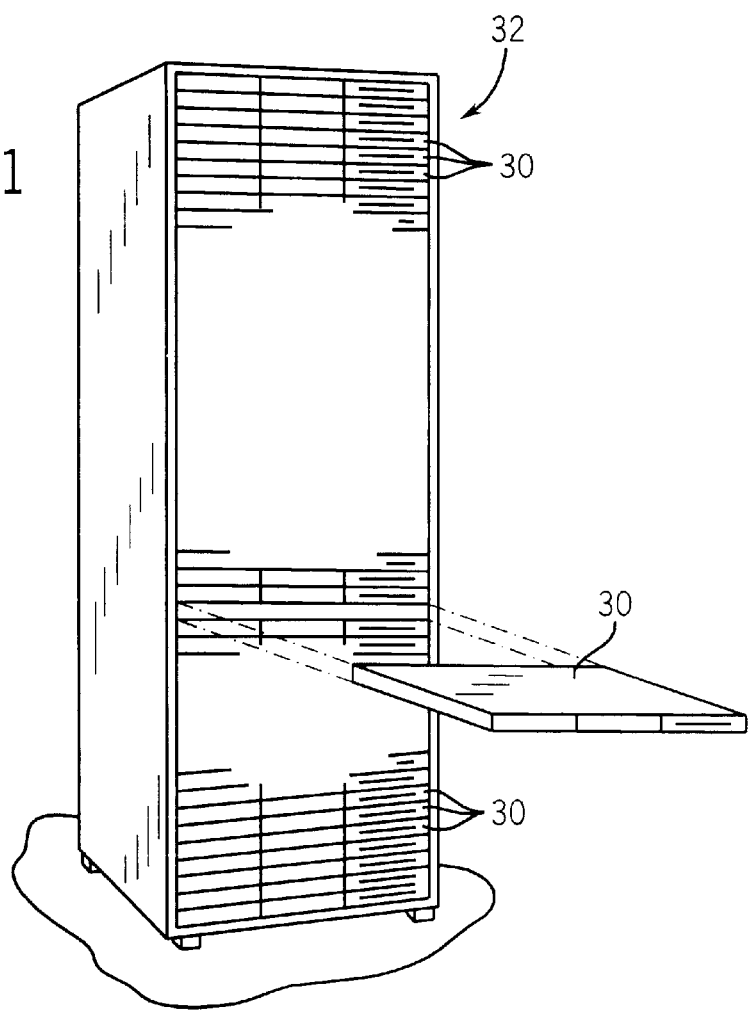
FIG. 1 is a perspective view of a rack with a plurality of processor-based devices, e.g. servers, mounted therein.
Figure 2:
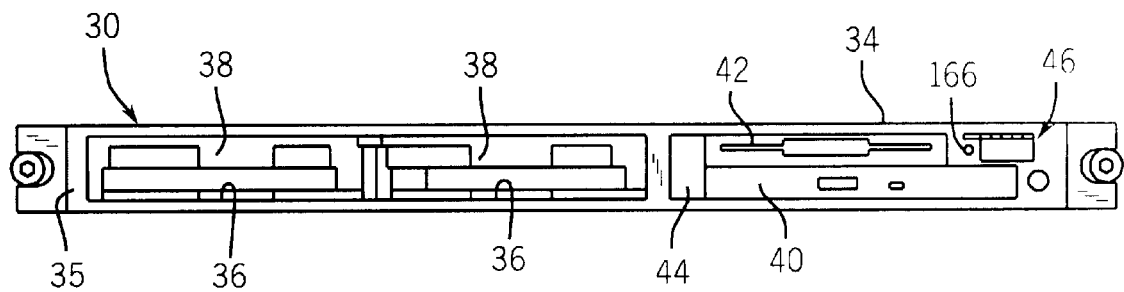
FIG. 2 is a front view of a low profile server.

Referring generally to FIG. 1, an exemplary implementation of the present invention is illustrated. In this embodiment, a plurality of densely packaged, processor-based devices 30 are shown mounted in a rack system 32. Rack system 32 is designed to slidably receive a plurality of the processor-based devices 30. Typically, devices 30 are mounted on retractable rails that permit the device to be moved between a retracted position within rack 32 and an extended position in which the device is at least partially extended from rack system 32. This extension allows removal or servicing of an individual device 30, as illustrated in FIG. 1.

Throughout this description, an exemplary processor-based device is described and referenced as server 30, but other devices also can benefit from the unique features described herein. The exemplary server 30 is a low profile server, such as a 1U server designed to occupy one unit of vertical space in rack system 32.

Server 30 includes a chassis 34 having a front 35 designed with pair of drive bays 36. Drive bays 36 are configured to receive a pair of hot pluggable drives 38. The front of chassis 34 also may be designed to receive an ejectable CD drive assembly 40 and an ejectable floppy drive assembly 42. In the particular design illustrated, CD drive assembly 40 and floppy drive assembly 42 are combined and removable or insertable as a single unit. The exemplary design also includes other features, such as a retractable liquid crystal display (LCD) 44 and an indicator panel 46.

Figure 3:
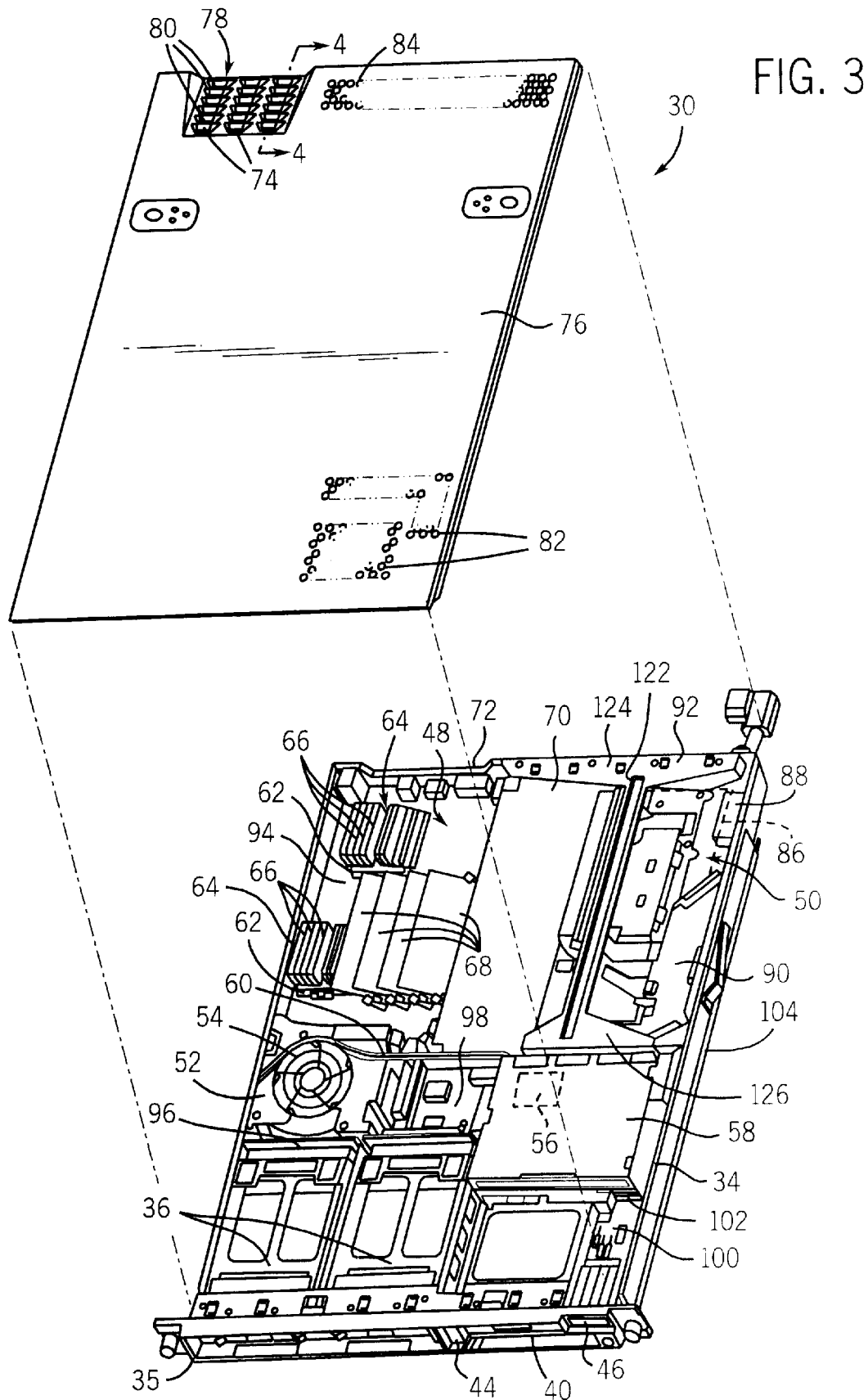
FIG. 3 is a partially exploded perspective view of the server illustrated in FIG. 2.
Figure 4:
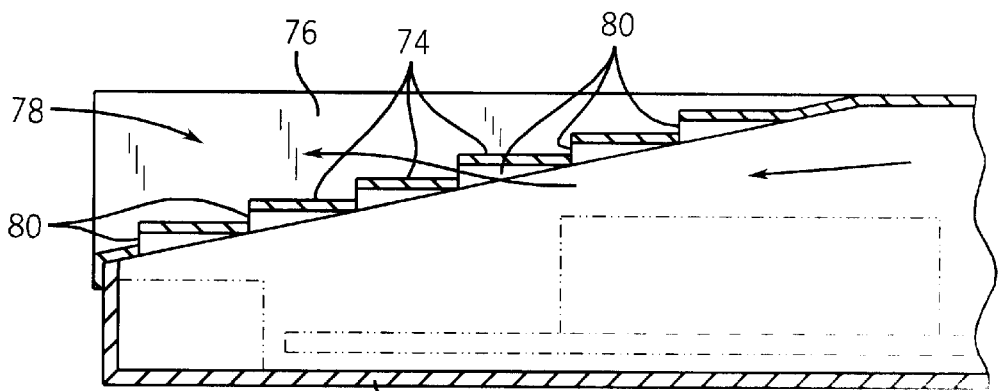
FIG. 4 is a cross-sectional view taken generally along line 4—4 of FIG. 3.

In server 30, components are densely packaged, but adequate cooling of the components is maintained. As illustrated in FIG. 3, chassis 34 is divided into at least two general zones, including a high pressure, high airflow zone 48 and a relatively low pressure, low flow zone 50. An airflow is created into high pressure zone 48 by a blower assembly 52. Blower assembly 52 typically includes a fan 54, such as a centrifugal fan, e.g. an exemplary blower unit is a 24 volt Gamma blower. Similarly, airflow through low pressure zone 50 is created by a blower 56. In the embodiment illustrated, blower 56 comprises a fan integral with an internal power supply 58 oriented such that its fan discharges airflow into low pressure zone 50.

Preferably, blower assembly 52 discharges airflow at a greater rate and pressure than blower 56. Thus, the air pressure created in high pressure zone 48 is maintained at a higher level than the air pressure in low pressure zone 50 during operation of the fans. This ensures sufficient airflow across densely packed, heat producing components disposed within high pressure zone 48 of chassis 34.

To ensure that minimal high pressure air from zone 48 flows into low pressure zone 50, open areas between the zones have been blocked by an air baffle 60. Air baffle 60 prevents the output of blower assembly 52 from disrupting the air flow created through low pressure zone 50 by blower 56.

Exemplary components disposed in high pressure zone 48 include one or more, e.g. two, processors 62, each coupled to a corresponding heat sink 64. Each heat sink 64 includes a plurality of cooling fins 66 that decrease in height along an inwardly directed end to provide additional room for other components. For example, a plurality of memory modules 68, e.g. DIMMs, may be mounted within high pressure zone 48 at an angle to facilitate the low profile design of chassis 34. In this embodiment, memory modules 68 are disposed at an angle over at least one of the heat sinks 64, but the decreasing height of the inwardly disposed cooling fins permit the memory modules to be so oriented without contacting the heat sink. Another exemplary component disposed in high pressure zone 48 is a PCI card 70.

In operation, blower assembly 52 draws air in along drives 38 and discharges the airflow into high pressure zone 48. The size and capacity of the fan is adjusted according to the size of chassis 34 and the layout of components disposed in high pressure zone 48. However, the capacity should be sufficient to create enough pressure in high pressure zone 48 that the necessary quantity of cooling air passes across the components disposed in zone 48, e.g. heat sinks 64 and memory modules 68.

Preferably, the airflow is discharged towards the rear of chassis 34. In the illustrated embodiment, chassis 34 includes a cutout region 72 for receiving an air outlet or vent through which air is discharged from high pressure zone 48. For example, a vent region 74 may be disposed in a cover 76 designed to fit over chassis 34 and enclose high pressure zone 48 and low pressure zone 50. Vent region 74 is disposed in a "scooped" region 78 of cover 76. When cover 76 is disposed on chassis 34, scooped region 78 extends inwardly into the interior of chassis 34 in high pressure zone 48 along cutout region 72. As illustrated best in FIG. 5, vent region 74 includes a vent and preferably a plurality of vents 80 that permit the airflow to exit generally in a direction in line with the discharge from blower assembly 52. Exemplary vents 80 are formed as a plurality of louvers along scooped region 78.

Cover 76 also may include an air inlet 82 and an air outlet 84 for blower 56, or alternatively, inlet 82 and outlet 84 can be formed through chassis 34. As blower 56 is operated, air is drawn through inlet 82 along the combined CD/floppy drive and into the power supply assembly 58. The air is discharged from blower 56 into low pressure zone 50 until it exits through outlet 84. Low pressure zone 50 may include a variety of components that vary according to the design of chassis 34 and server 30. In the exemplary embodiment, low pressure zone 50 includes a PCI card 86, an inline EMI filter 88 and an internal array controller cable tray 90.

Other features of server 30 include a dual PCI card and an ejectable riser assembly 92 to which PCI cards 70 and 86 are attached. Also, DIMM modules 68 and processors 62 preferably are attached to a motherboard 94. Drives 38 are coupled to a removable SCSI back plane 96. A raid on a chip (ROC) board 98 is disposed intermediate blower assembly 52 and power supply 58. A power switch and LED PC board 100 is deployed within chassis 34 generally proximate indicator panel 46 for cooperation therewith. A back plane 102 for the combined CD and floppy assembly is deployed between floppy drive assembly 42/CD assembly 40 and power supply 58. Additionally, a pair of mounting rails 104 can be attached to the sides of chassis 34 to permit engagement with corresponding rails of rack system 32, as described below. It should be noted that a variety of component arrangements can be utilized, however, the exemplary illustrated arrangement provides for a dense packaging of components separated into two cooling zones that are able to readily maintain the components at desirable operating temperatures. Several of the unique, inventive features that facilitate the above-described packaging are described below.

Figure 5:
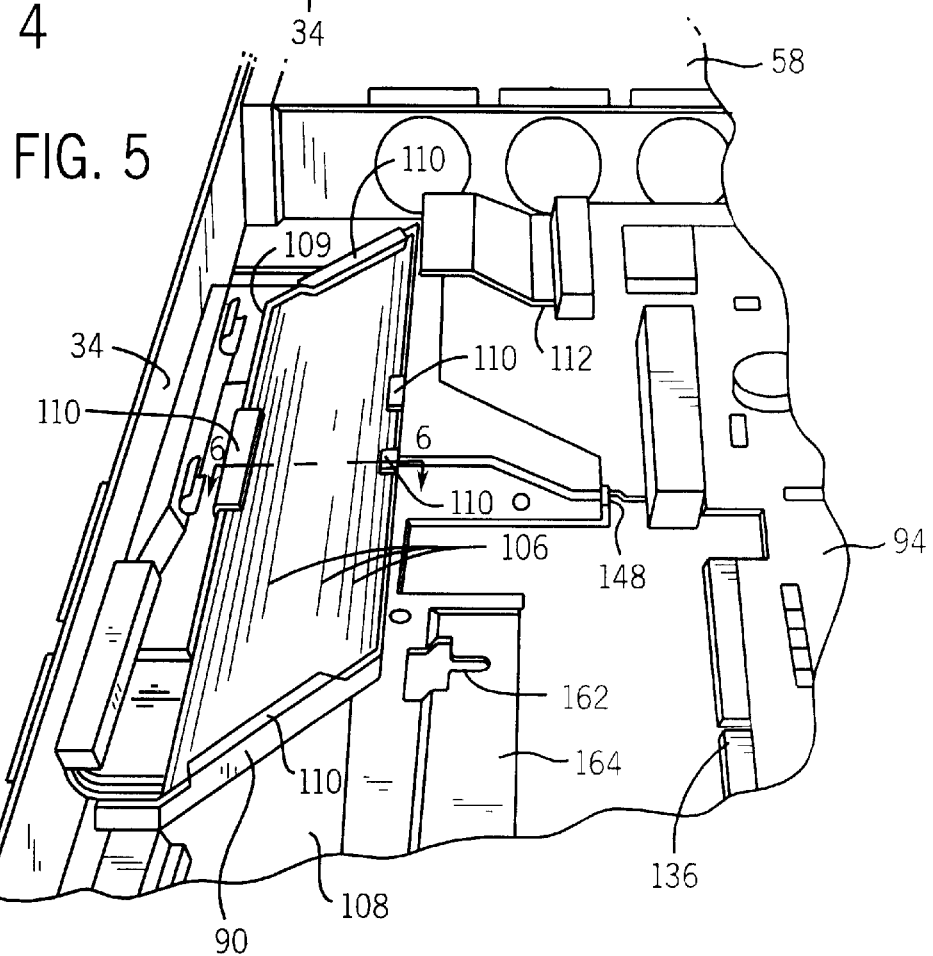
FIG. 5 is a perspective view of a cable tray disposed within the chassis of an exemplary server.
Figure 6:
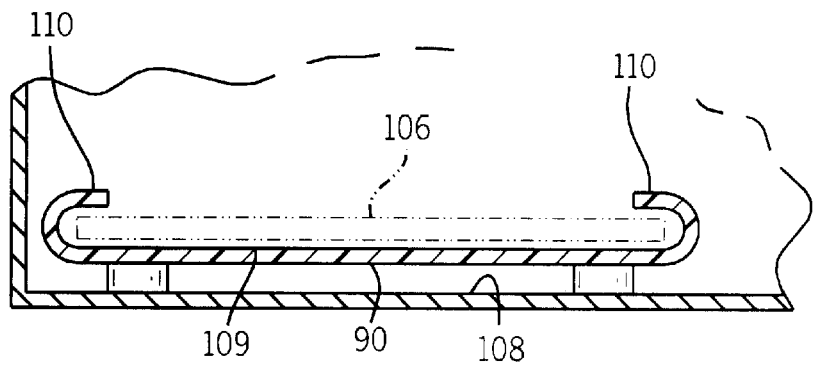
FIG. 6 is a cross-sectional view taken generally along line 6—6 of FIG. 5.
Figure 7:
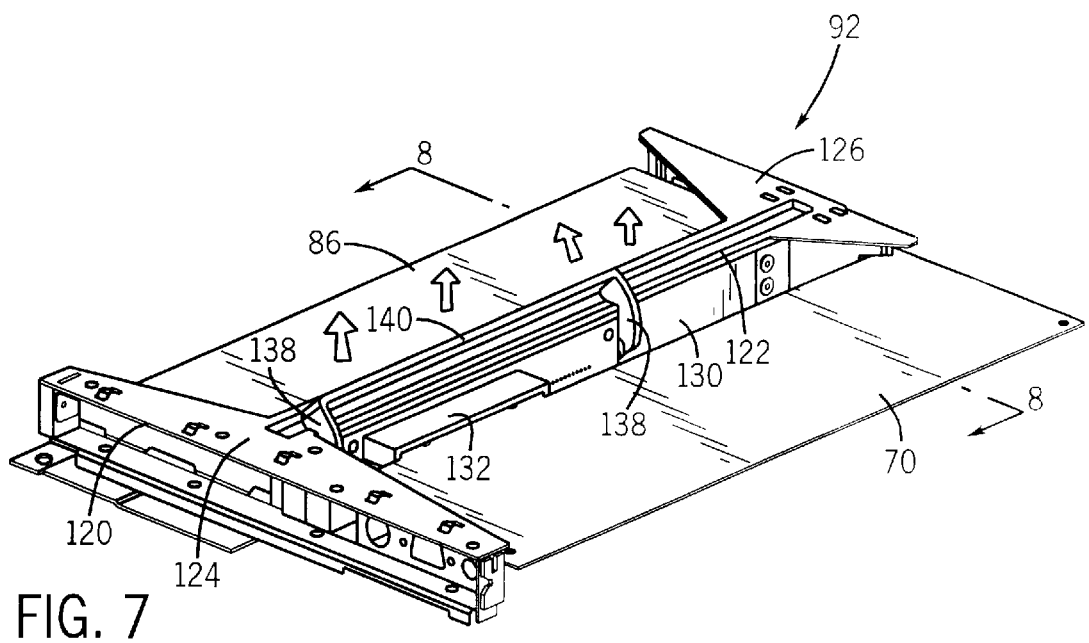
FIG. 7 is a perspective view of a PCI card riser assembly designed for mounting in a low profile chassis of an exemplary server.

One of the unique features of server 30 is cable tray 90. In low profile servers, such as the illustrated 1U server, larger SCSI cables can interfere with the fit of internal components as well as being detrimental to thermal performance, e.g. heat removal. Cable tray 90 is designed to hold an SCSI cable 106 and to lie generally flat along a floor 108 of chassis 34. The low profile tray holds cable 106 substantially out of the airflow through low pressure zone 50. Thus, cable 106 can be used to form an electrical connection between a PCI card and motherboard 94 without interrupting airflow and thermal performance. Preferably, cable tray 90 includes a flat base 109 and a plurality of tabs 110 that extend over and retain cable 106, as illustrated in FIGS. 5 and 6. Preferably, tabs 110 extend upwardly from flat base 109 and may be integrally formed with flat base 109, as by plastic injection molding.

In the particular embodiment illustrated, SCSI cable 106 is connected to the board edge of motherboard 94 by an SCSI connector 112. Electrically, a control signal is implemented on an internal SCSI connector for an adapter to electrically switch the signal paths from being driven by an onboard controller to being driven by the adapter controller. The signal path preferably is optimized so that when no adapters are plugged in, there will be negligible impact on the signal quality.

Figure 8:
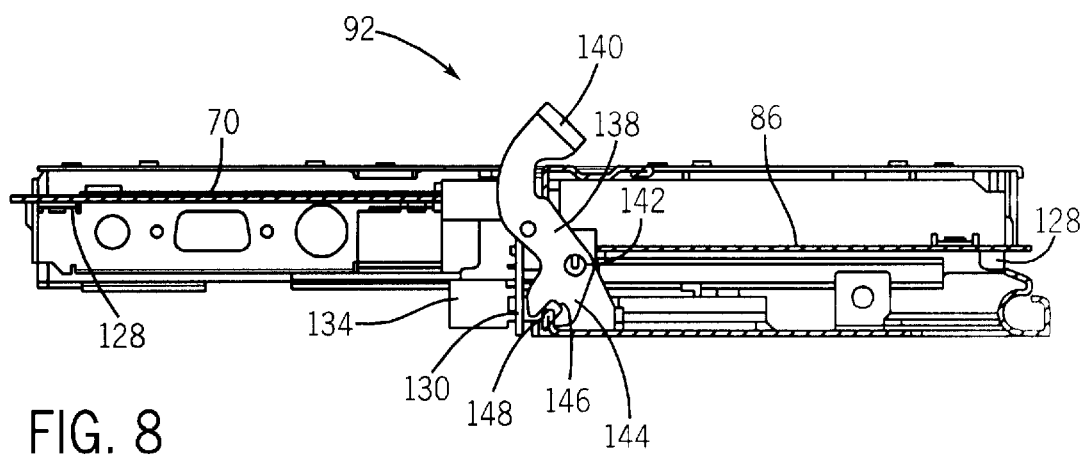
FIG. 8 is a cross-sectional view of the PCI card assembly taken generally along line 8—8 of FIG. 7.
Figure 9:
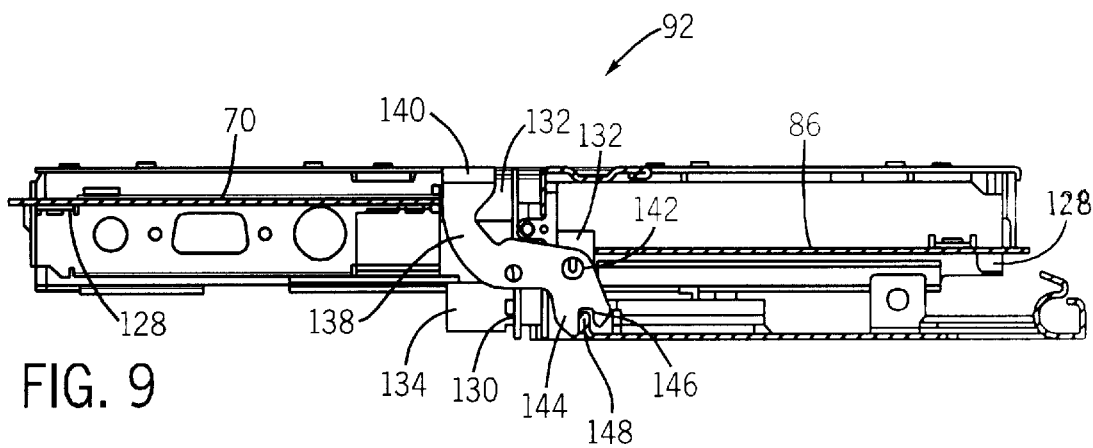
FIG. 9 is a cross-sectional view similar to FIG. 8 but showing the PCI card assembly in an eject position.
Figure 10A:
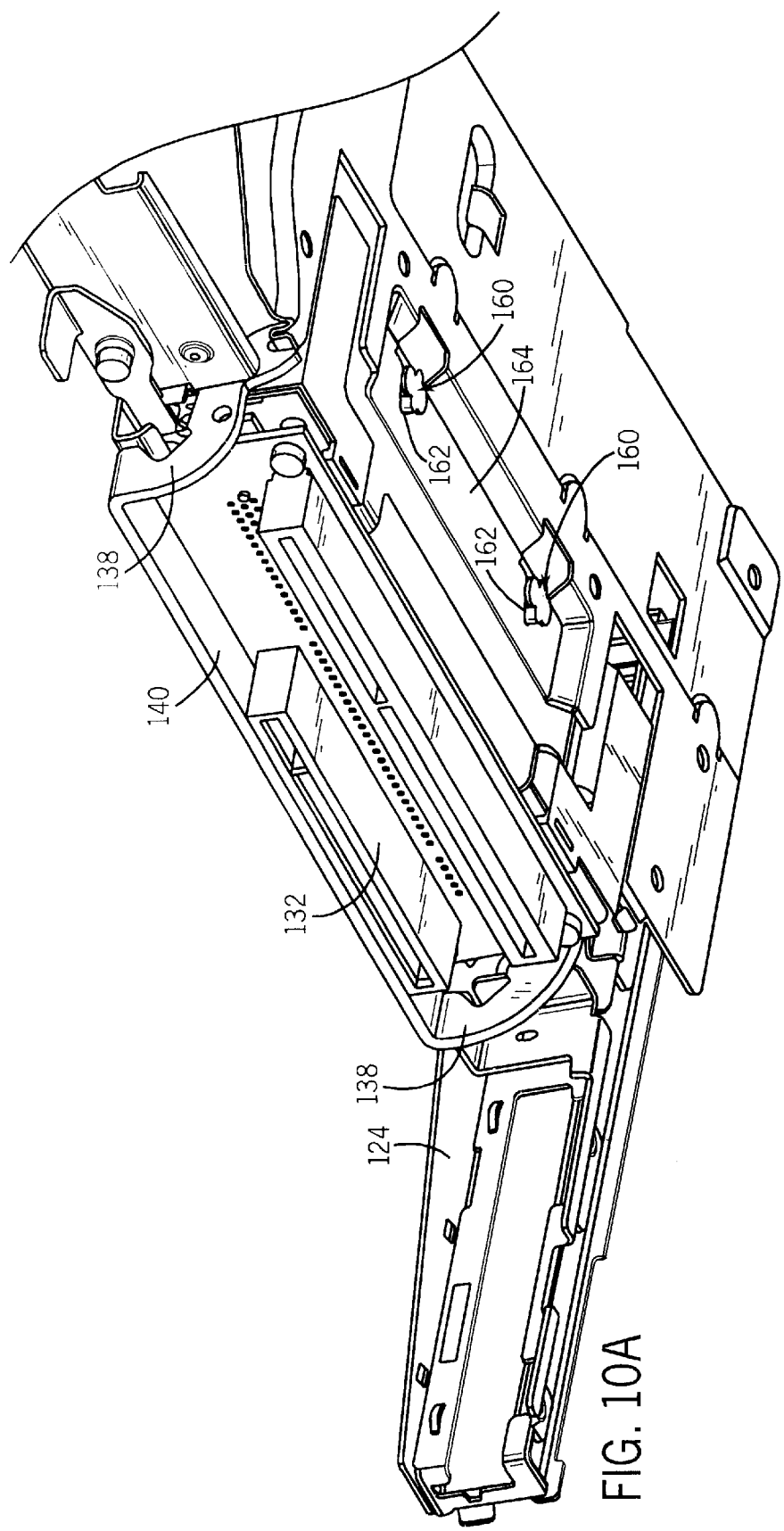
FIG. 10A is a perspective bottom view of the riser assembly illustrated in FIG. 7.

Another feature that facilitates the dense packaging of components within chassis 34 is riser assembly 92, illustrated best in FIGS. 7 through 10A. The design of riser assembly 92 permits the mounting of at least two full length PCI cards, such as PCI cards 70 and 86, as illustrated in FIGS. 8 through 10. Riser assembly 92 includes a framework 120 having a center frame portion 122 disposed between PCI cards 70 and 86 and a pair of frame ends 124, 126 that are disposed generally perpendicular to center frame portion 122. Frame ends 124 and 126 preferably are spaced apart to slidably receive PCI cards 70 and 86. Typically, each frame end 124 and 126 includes appropriate supports 128 for supporting each PCI card.

Additionally, riser assembly 92 includes a PCI riser card 130 disposed along center frame portion 122. A pair of oppositely facing connectors 132 are electrically coupled to PCI riser card 130 and extend in opposite directions therefrom for coupling with PCI card 70 and PCI card 86. Connectors 132 are mounted to PCI riser card 130 in a vertically staggered arrangement. Additionally, a riser card connector 134 is mounted to riser card 130 and configured for connection with motherboard 94 at a connection location 136 (see FIG. 6) to permit communication with PCI cards 70 and 86.

Additionally, riser assembly 92 includes a lever and preferably a pair of levers 138 connected by a handle 140. Lever or levers 138 are pivotably mounted to riser assembly 92, preferably at center frame portion 122 for pivotable motion about a pivot mount 142. Each lever 138 also includes an engagement end 144 that has an engagement feature, such as a recess 146 designed to engage a rib 148, typically mounted on chassis floor 108 (see also FIG. 6).

When riser assembly 92 is moved downwardly into chassis 34 (generally over cable tray 90), engagement end 144 and recess 146 engage rib 148, as illustrated best in FIG. 9. Handle 140 is then pressed to pivot lever 138 about pivot 142, thereby driving riser card connector 134 into engagement with a corresponding connector, e.g. a connector on motherboard 94, and riser assembly 92 into proper position. To remove riser assembly 92, handle 140 simply is pulled upwardly which moves riser assembly 92 and riser card connector 134 laterally to permit lifting of the entire assembly from chassis 34.

It should be noted that riser assembly 92 may be further secured in chassis 34 by a plurality of engagement features. For example, as illustrated in FIGS. 10 and 10A, a plurality of pins and receptor slots can be used to secure riser assembly 92 into chassis 34 when levers 138 are pivoted to an installed position. As illustrated in FIG. 10, frame end 126 may be designed with a pin 150 and a receiving slot 152 that are located for engagement with a corresponding receiving slot 154 and pin 156, respectively, that are attached to chassis 34. In this embodiment, receiving slot 134 is formed in a tab 158 that extends upwardly from chassis floor 108, and pin 156 also is formed to extend generally upwardly from chassis floor 108 for sliding engagement with receiving slot 152.

As illustrated best in FIG. 10A, riser assembly 92 may also include one or more, e.g. two, pegs 160 that extend generally downwardly from the bottom of center frame portion 122. Pegs 160 are located for engagement with corresponding slots 162 formed in a bracket 164 mounted to chassis floor 108 (see also FIG. 6). Bracket 164 and slots 162 are designed to engage and retain pegs 160 when levers 138 move riser assembly 92 into its installed position, as illustrated best in FIG. 8.

Figure 11:
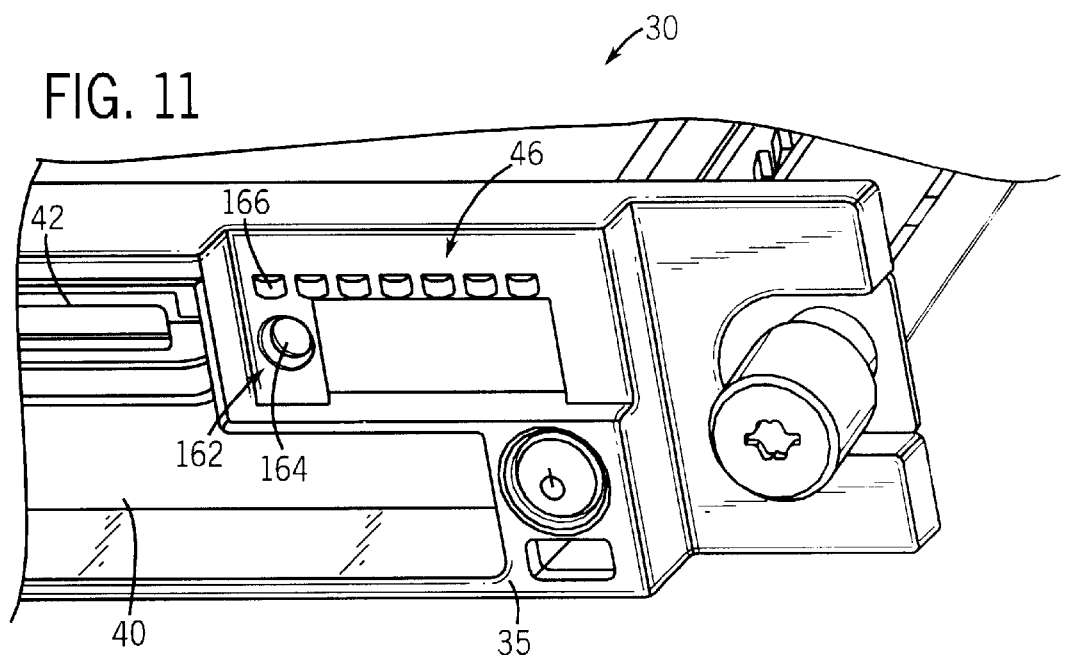
FIG. 11 is a partial front view of an exemplary server illustrating an indicator.
Figure 12:
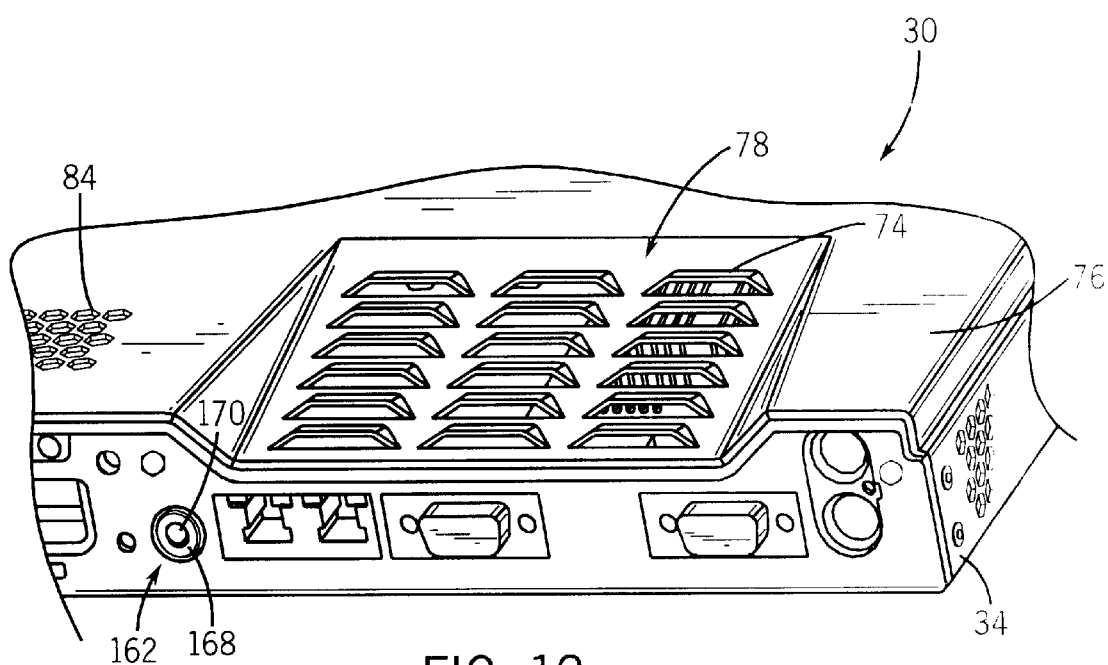
FIG. 12 is partial rear view of an exemplary.server illustrating a rear indicator.
Figure 13:
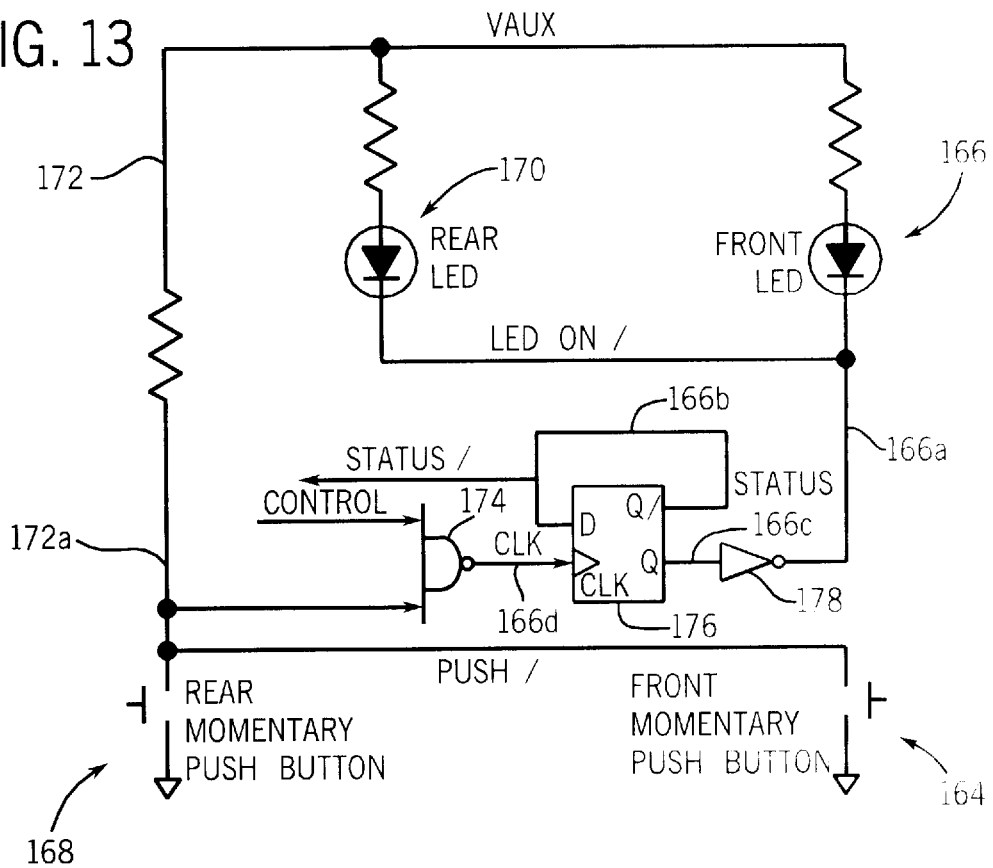
FIG. 13 is a circuit diagram for use with the indicators illustrated in FIGS. 11 and 12.

Another unique feature of server 30 is an indicator system 162 illustrated in FIGS. 11 through 13. Indicator system 162 permits a technician to identify the appropriate server 30, or other processor-based device, that-requires attention and to disconnect the unit without risking disconnection of the wrong unit.

When multiple servers are mounted in a rack, particularly when the units have low profiles, such as 1U servers, it can be difficult for a technician to ensure that he or she unplugs the proper unit at the rear when the unit was initially identified from the front. Thus, indicator system 162 can be activated to provide an indicator of the desired server from the front of the server and from the rear of the server. A variety of tags, logos, audible indicators etc. could be activated by an actuator to provide appropriate designation of the server requiring attention.

However, a preferred indicator system 162 provides a front switch 164 and a front light 166, as illustrated in FIG. 11. Similarly, exemplary indicator system 162 provides a rear switch 168 and a rear light 170, as illustrated in FIG. 12. When either front switch 164 or rear switch 168 is depressed while lights 166 and 170 are off, both lights 166 and 170 are illuminated. If either switch 164 or 168 is depressed while lights 166 and 170 are illuminated, both lights 166 and 170 turn off.

This allows an individual to identify a unit requiring attention from the front. Once identified, front switch 164 is depressed to illuminate front light 166 and rear light 170. The individual may then walk around to the back of a rack containing multiple units, identify the unit having an illuminated rear light 170, and unplug cables from the unit. The unit then can be removed from the front of the rack for service or replacement. This prevents the inadvertent disconnection of the wrong unit. Lights 166 and 170 preferably have a visually noticeable color, such as a blue color.

Figure 13A:
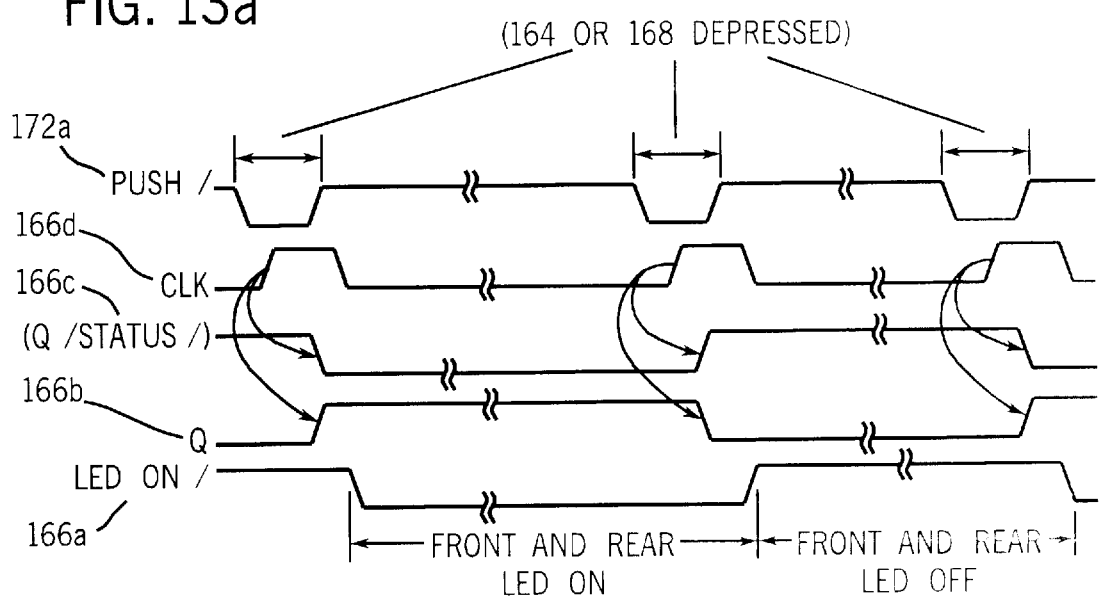
FIG. 13a is a diagram representing the functionality of the circuit illustrated in FIG. 13.

An exemplary circuit for use in indicator system 162 is illustrated in FIG. 13 and the functionality of the circuit is illustrated in FIG. 13a. The exemplary circuit may be powered by an auxiliary power supply Vaux 172. Power supply 172 may be separated from the main system power supply which allows the circuitry to be operated even when the main system power is off. Other components of the circuit include a NAND-gate 174, a D-flipflop 176 and an inverter 178.

In this exemplary embodiment, the D-flipflop 176 is illustrated after its reset condition, that is its output Q is low and Q/ is high. When either push button 164 or 168 is depressed, the signal line PUSH/ (labeled 172a) level changes from high to low. This signal transition causes the clock input signal, CLK 166d, of D-flipflop 176 to change from low to high, via NAND-gate 174. The clock signal latches the high state at the D input, therefore changing the Q output (labeled 166c) from low to high. Because the Q output signal is passed through the inverter 178, the signal (LED-ON/ 166a) at the cathode pins of LEDs 166 and 170 is changed from high to low. This turns on or illuminates LEDs 166 and 170. At this time, the D input of the flipflop 176 is low. When either push button 164 and or 168 is depressed again, the CLK input latches the low state from the D input, causing the Q output, STATUS 166c, to change from high to low. This transition goes through the inverter 178, effectively turning off both LED 166 and LED 170.

In the embodiment illustrated, one of the NAND-gate 174 inputs also can be controlled by software designed to allow LEDs 166 and 170 to be turned on, turned off or blinked. Application software on the server or on a remote server can be utilized to control the state of the LEDs. The D-flipflop 176 output Q/, STATUS/ 166b, also can be monitored by software. This would allow a technician from a remote site to control the state of LEDs 166 and 170 and to notify another technician in the server room as to which server requires service. Upon completion of the service work, the servicing technician would then push either button 164 or 168. The remote technician is thereby able to monitor the LED status and to determine completion of the service work. It should be noted that the figure and functionality described are exemplary, and other circuits can be used to accomplish the device identification described above.

Figure 14:
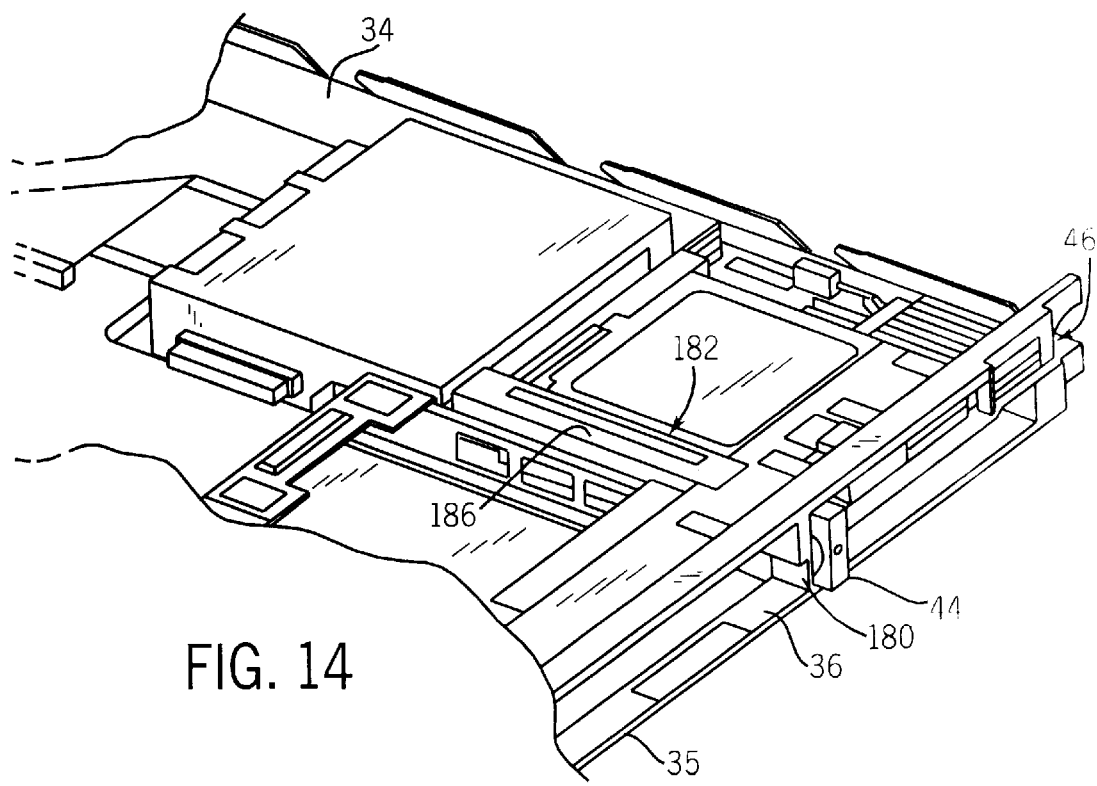
FIG. 14 is a perspective view of a retractable LCD module in a retracted position within an exemplary server.
Figure 15:
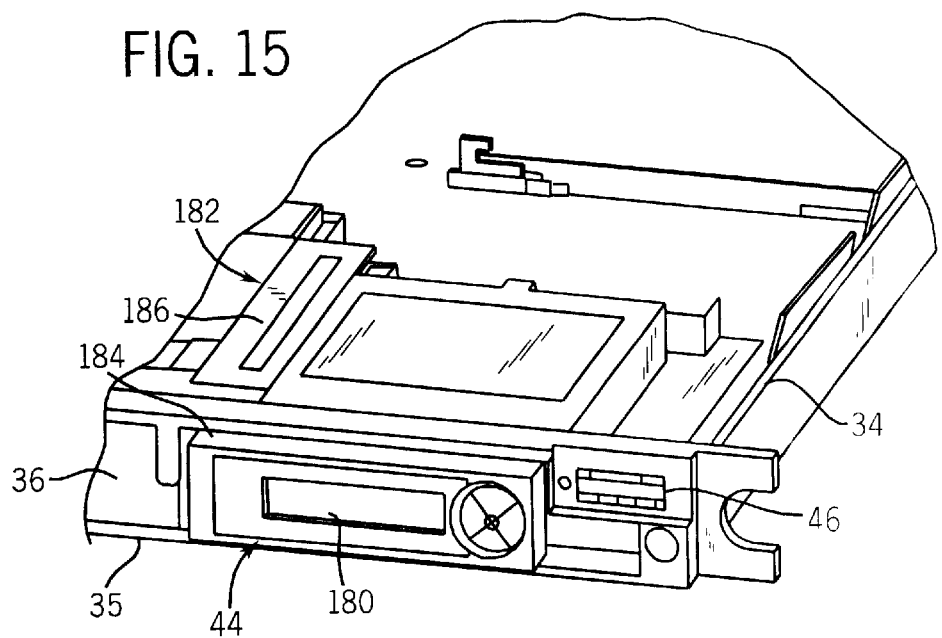
FIG. 15 is a perspective view of the retractable LCD unit illustrated in FIG. 14 but in an open or operable position.

Another unique feature of the exemplary server 30 is the retractable LCD 44, illustrated in FIGS. 14 through 17. The liquid crystal display module 44 can be moved between a retracted position, as illustrated in FIG. 14, and a display or open position, as illustrated in FIG. 15.

The LCD module includes a display 180 that can be used as a visual interface for various information related to the operation of server 30. However, when LCD module 44 is not in use, it can be moved to the retracted position to permit access to CD drive assembly 40 and floppy drive assembly 42.

LCD module 44 is pivotably mounted to a retraction assembly 182 by a module pivot 184 that allows LCD module 44 to be pivoted between the display position and a position generally perpendicular to the front of server 30 for retraction. Retraction assembly 182 includes an outer guide housing 186 disposed generally between floppy drive assembly 42/CD drive assembly 40 and drive bays 36. Outer guide housing 186 is designed to slidably receive LCD module 44 therein.

Figure 16:
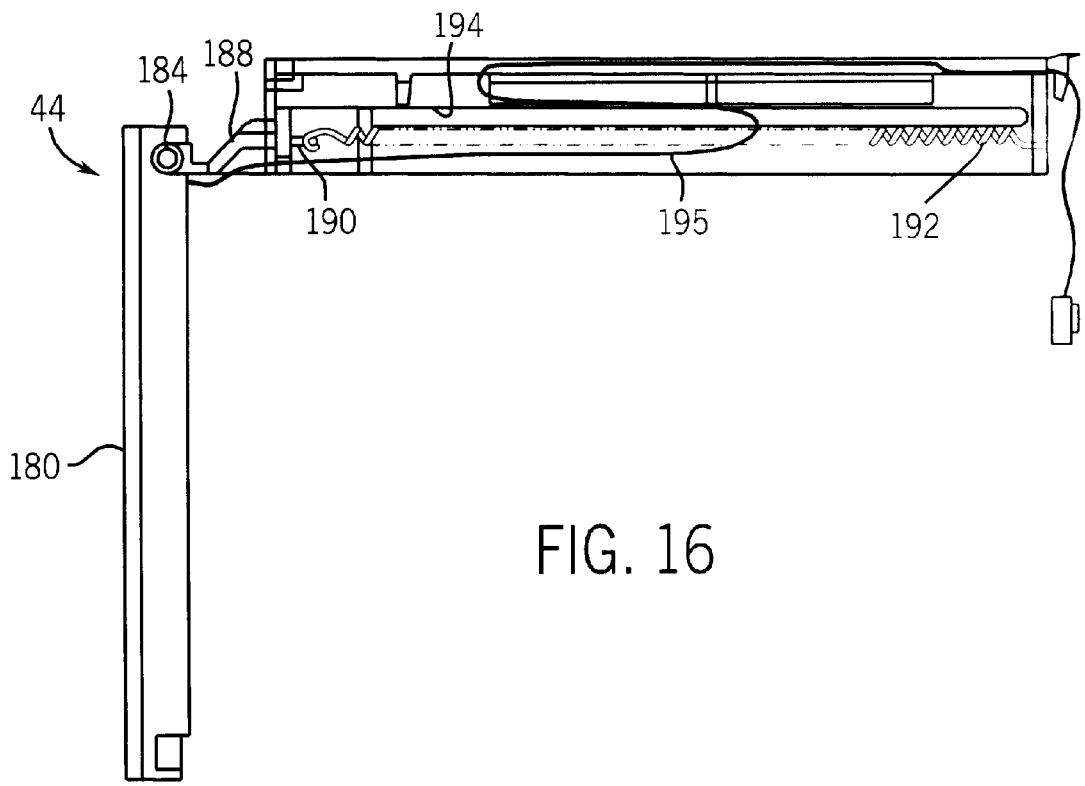
FIG. 16 is a top view of the LCD unit in an open position.
Figure 17:
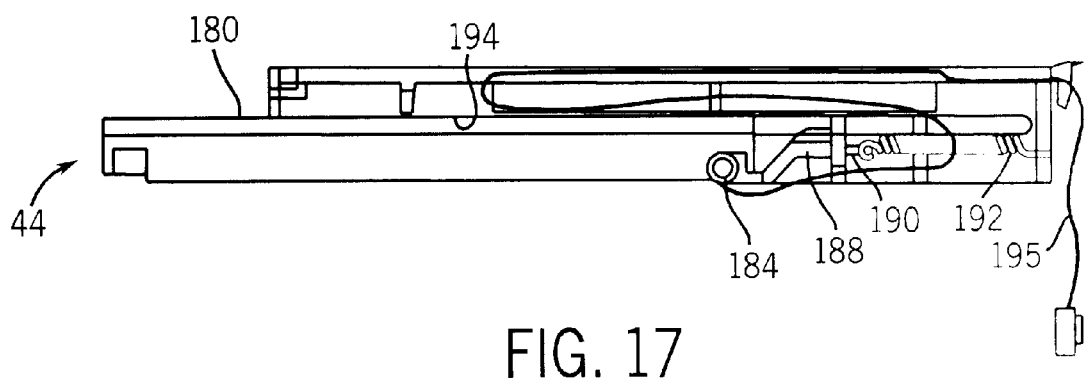
FIG. 17 is a top view similar to FIG. 16 but with the LCD unit in a retracted position.

Retraction assembly 182 further includes a pivot mount bracket 188 to which module 44 is pivotably mounted via pivot 184, as best illustrated in FIGS. 16 and 17. Generally opposite pivot 184, bracket 188 includes one or more attachment features 190 to which one or more resilient members, such as a pair of springs 192 can be attached. Preferably, a pair of springs positioned above and below each other are used to balance the biasing force on pivot mount bracket 188 and LCD module 44 as LCD module 44 is drawn into an open interior 194 of outer guide housing 186. Exemplary springs 192 include coil springs that are pulled to a stretched position when LCD module is moved to its open or display position. Thus, the coil springs bias LCD module 44 back into open interior 194 when module 44 is pivoted to a position generally in alignment with open interior 194. An appropriate electric line or lines 195 may be routed to LCD module 44 through outer guide housing 186, as best illustrated in FIGS. 16 and 17.

When units, such as servers, are stacked sequentially in rack system 32, the various cables coupled to the various server ports can be difficult to manage. This is particularly true with low profile servers, such as 1U servers, due to the relatively large number of closely spaced units. Accordingly, the densely stacked servers benefit from a cable management system 200, such as that illustrated in FIGS. 18 and 19.

The exemplary cable management system 200 includes a tray bracket 202 mounted to and extending rearwardly from each server 30. At least one and preferably a pair of spools 204 serve as a cable support member and are mounted to tray bracket 202 in a position that permits the plurality of various cables 206, to be wrapped and held generally along the backside of server 30.

Spools 204 can be mounted in a variety of locations depending on the design of server 30 and rack system 32, but the spools are preferably located in positions to provide strain relief for the cables and to bundle the cables for routing.

Cable management system 200 further includes a tension device 208 and a retainer member 210. Tension device 208 and retainer 210 preferably are mounted towards the back of rack system 32 generally on a level with server 30. Retainer 210 may be mounted or formed at a position on an opposite side of rack system 32 from tension device 208, as illustrated in FIGS. 18 and 19. Retainer 210 also is positioned slightly rearward of tension device 208.

In an exemplary embodiment, tension device 208 comprises a tension reel 212, such as a torsion spring loaded reel, having an extensible member 214, such as a cord or cable. Extensible member 214 is connected to cable bundle 206 at a location intermediate the cable connectors plugged into the rear of server 30 and retainer 210. Specifically, extensible member 214 is connected to cable bundle 206 generally intermediate the position at which cable bundle 206 is in contact with retainer 210 and the position of the closest spool 204. Thus, when a specific server 30 is slid to an extended position in rack system 32, extension member 214 is pulled outwardly, as illustrated in FIG. 19. However, when the server is returned to its retracted position within rack system 32, extension member 214 is retracted into tension reel 212, thereby pulling cable bundle 206 to a neatly folded position to the rear of server 30, as illustrated in FIG. 18.

When multiple thin profile devices, e.g. servers, are mounted in a rack system 32, a rack rail must be positioned for engagement with the side mounting rails 104 attached to chassis 34 of each device 30. With low profile devices, multiple rails must be deployed in rack system 32 to receive the multiple corresponding servers. To facilitate assembly of rack system 32, and specifically the attachment of rack rails for supporting each device 30, unique rails have been designed for easy insertion and removal.

Figure 20:
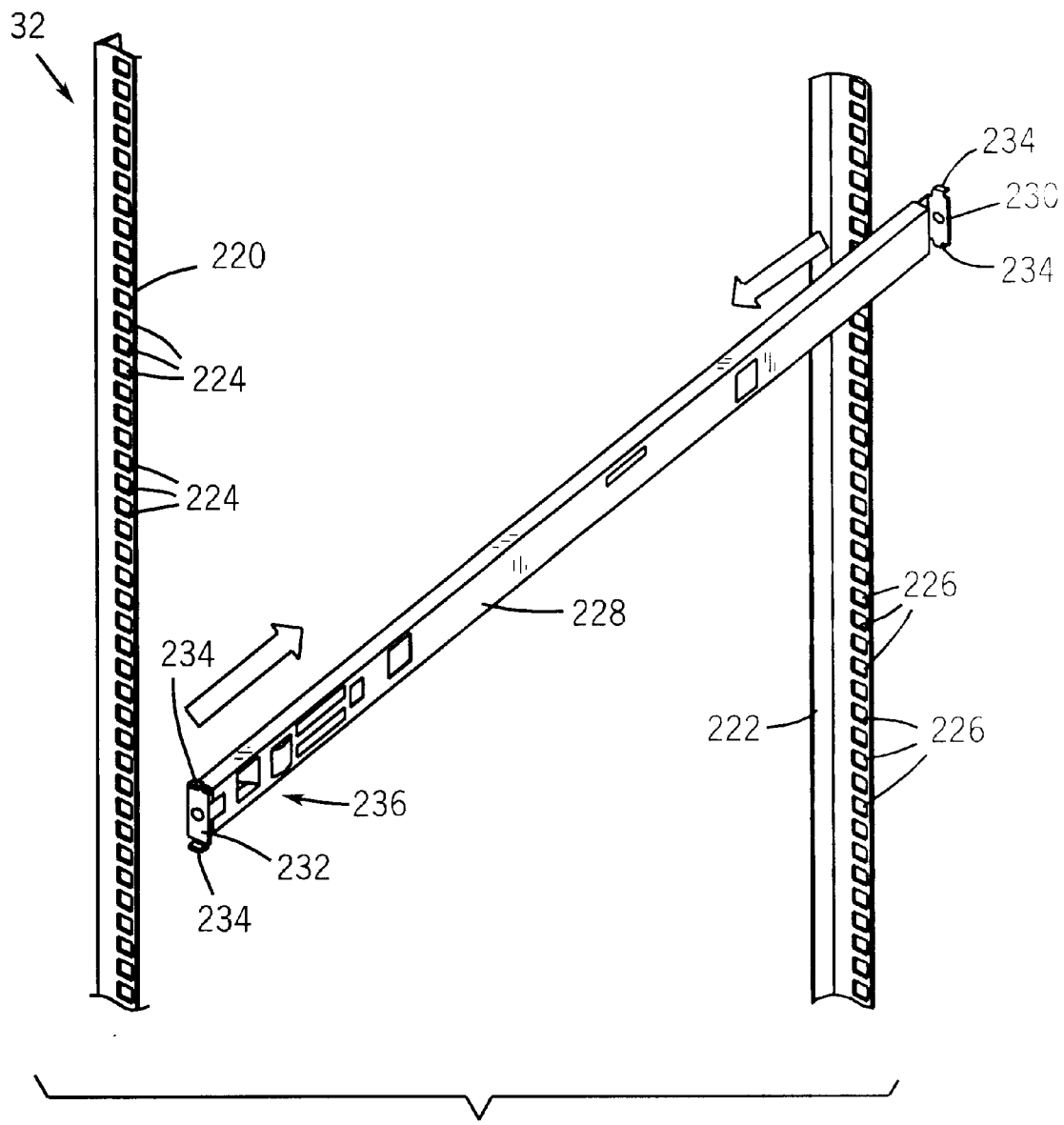
FIG. 20 is a perspective view of a portion of an exemplary rack and rail.

As illustrated best in FIG. 20, a preferred rack system includes a front support member 220 and a back support member 222 on each side of rack system 32. Front support member 220 includes a plurality of mounting openings 224 that inhabit a substantial portion of the member. Similarly, rear support member 222 includes a plurality of mounting openings 226 that extend upwardly for a substantial distance along the support member. The mounting openings are designed to receive a rail 228 that extends from the front to the rear of rack system 32 between front support member 220 and rear support member 222. It should be noted that mounting openings 224 and 226 can be in a variety of configurations and can be changed to mounting tabs, brackets or other features able to engage the corresponding mounting ends of each rail 228.

In the illustrated embodiment, each rail 228 includes a rear mounting end 230 and a front mounting 232. Each mounting end 230, 232 includes engagement features for engaging the mounting structures along front and rear support members 220, 222. In the exemplary, illustrated embodiment, rear mounting end 230 and front mounting end 232 each include a pair of tabs 234 sized and spaced for receipt in corresponding mounting openings 222. Thus, rail 228 may be positioned at multiple different locations along support members 220 and 222.

Figure 21:
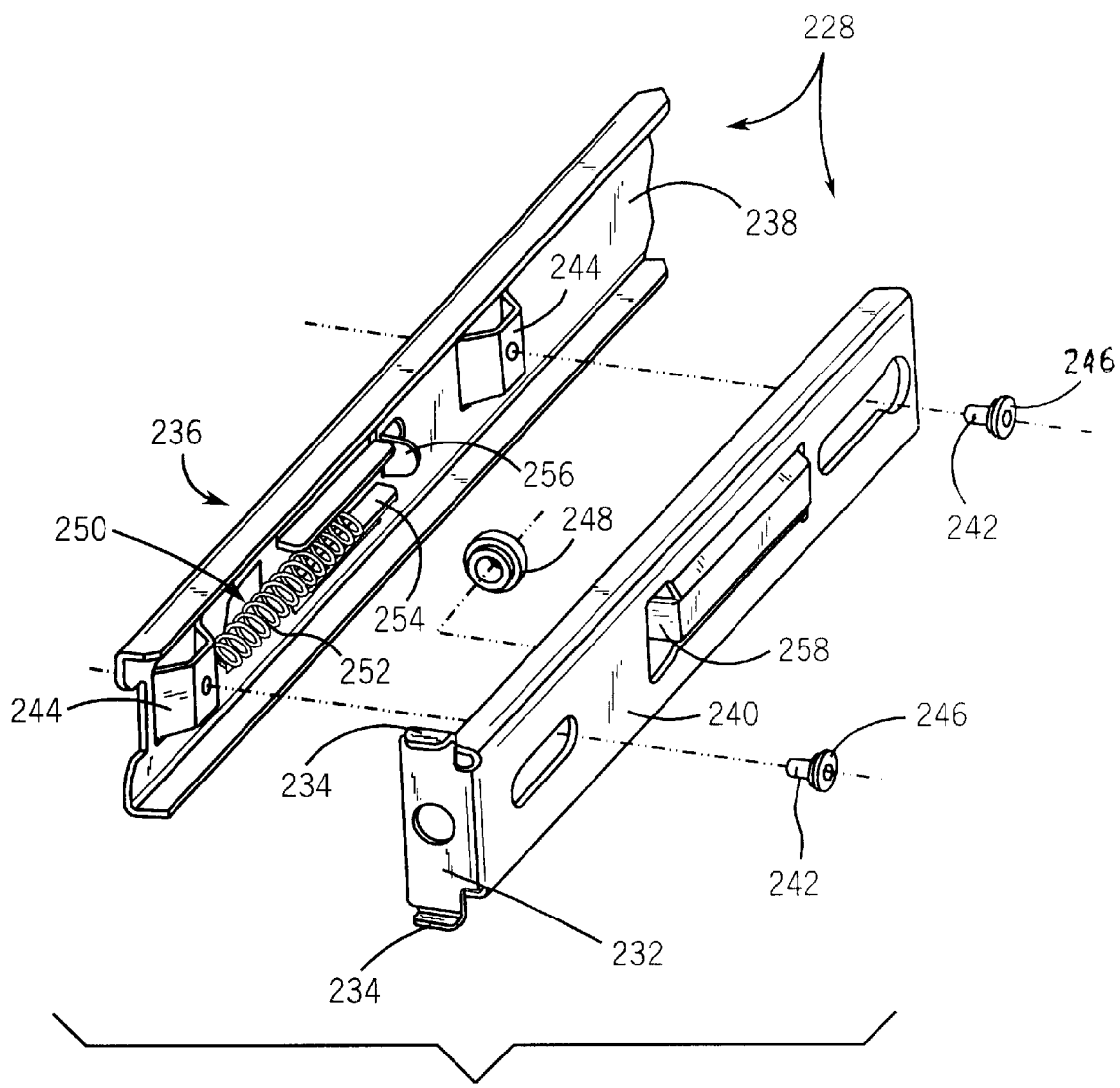
FIG. 21 is an exploded view of an end of the rail illustrated in FIG. 20.

In the preferred embodiment, rear mounting end 230 is fixed and front mounting end 232 is resiliently movable. Alternatively, rear mounting end 230 can be made resiliently movable, or both mounting ends can be made resiliently movable. Regardless, an exemplary resiliently movable mechanism 236 is illustrated best in FIG. 21.

In this embodiment, rail 228 includes a first rail portion 238 and a second rail portion 240 that may be slidably coupled to first rail portion 238 by a plurality of pins or fasteners 242. As illustrated, second rail portion 240 is formed with a pair of slots through which pins 242 extend into contact with corresponding mounting brackets 244 disposed on the interior of first rail portion 238. Heads 246 of pins 242 retain second rail portion 240 slidably trapped against first rail portion 238. In this embodiment, front mounting end 232 is formed at the front of second rail portion 240 for selective, sliding movement into and out of engagement with mounting openings 224 of front support member 220. Front mounting end 232 may include a bumper 248 to buffer the contact between first rail portion 238 and second rail portion 240 when sliding second rail portion 240 farther into first rail portion 238.

To ensure that rear mounting end 230 and front mounting end 232 remain firmly connected to rear support member 222 and front support member 220, respectively, second rail portion 240 is biased outwardly from first rail portion 238 by a biasing system 250. An exemplary biasing system 250 includes a coil spring 252 disposed within a channel 254 located on the interior of first rail portion 238. An abutment tab 256 is disposed at an interior end of channel 254. A second abutment tab 258 extends inwardly from second rail portion 240 generally at an end of spring 252 longitudinally opposite of abutment tab 256 when second rail portion 240 is slidably mounted to first rail portion 238.

Thus, spring 252 biases second rail portion 240 and mounting end 232 in an outward direction to firmly move rear mounting end 230 and front mounting end 232 into engagement with rear support member 222 and front support member 220, respectively. However, rail 228 can quickly and easily be removed by overcoming the bias of spring 252 and forcing second rail portion 240 to slide inwardly into first rail portion 238. This resilient, movable mechanism 236 permits quick installation and removal of rails 228 from rack system 32 to accommodate the mounting of multiple devices, such as servers without the use of screws or other types of fasteners.

The actual features of rails 228 by which each server 30 is slidably mounted thereto depends on the configuration of mounting rails 104. However, a variety of available sliding rails 104 and corresponding mounting rails 228 can be utilized, as known to those of ordinary skill in the art.

It will be understood that the foregoing description is of preferred embodiments of this invention, and that the invention is not limited to the specific forms shown. For example, a variety of devices other than servers can benefit from the various features described herein; the configuration of the overall chassis and the location of components can be adjusted according to a specific application; the size and capacity of the blower assemblies can be adjusted according to each application; and a variety of materials can be utilized in the construction of various components described herein. These and other modifications may be made in the design and arrangement of the elements without departing from the scope of the invention as expressed in the appended claims.

What is claimed is:

1. A server designed to facilitate cooling of internal components, comprising:
   a server chassis divided into a first pressure zone and a second pressure zone;
   a first cooling fan disposed to direct airflow through the first pressure zone;
   a second cooling fan disposed to direct airflow through the second pressure zone, wherein the first pressure zone is maintained at a higher pressure than the second pressure zone during operation of the first cooling fan and the second cooling fan; and
   a cover portion disposed over the server chassis and having a scooped region extending inwardly into the server chassis, a vent being disposed in the scooped region.

2. The server as recited in claim 1, further comprising a processor heat sink disposed in the first pressure zone.

3. The server as recited in claim 1, wherein the vent is generally aligned with the direction of airflow through the first pressure zone.

4. The server as recited in claim 1, further comprising a hard drive, wherein the first cooling fan draws air across the hard drive.

5. The server as recited in claim 4, further comprising a plurality of DIMMs disposed in the first pressure zone.

6. The server as recited in claim 5, further comprising a PCI card disposed in the first pressure zone.

7. The server as recited in claim 1, further comprising a baffle disposed to prevent circulation of high pressure air into the second pressure zone.

8. The server as recited in claim 1, further comprising a power supply disposed in the server chassis, wherein the second cooling fan is disposed in the power supply.

9. A server designed to facilitate cooling of internal components, comprising:
   a server chassis divided into a first pressure zone and a second pressure zone;
   a first cooling fan disposed to direct airflow through the first pressure zone; and
   a second cooling fan disposed to direct airflow through the second pressure zone, wherein the first pressure zone is maintained at a higher pressure than the second pressure zone during operation of the first cooling fan and the second cooling fan, a vent to release air from the first pressure zone wherein the vent is disposed in a scooped region and comprises a plurality of louvers.

10. The server as recited in claim 9, further comprising a processor heat sink disposed in the first pressure zone.

11. The server as recited in claim 9, wherein the vent is generally aligned with the direction of airflow through the first pressure zone.

12. The server as recited in claim 9, further comprising a hard drive, wherein the first cooling fan draws air across the hard drive.

13. The server as recited in claim 9, further comprising a baffle disposed to prevent circulation of high pressure air into the second pressure zone.

14. The server as recited in claim 9, further comprising a power supply disposed in the server chassis, wherein the second cooling fan is disposed in the power supply.

15. The server as recited in claim 9, further comprising a plurality of DIMMs disposed in the first pressure zone.

16. The server as recited in claim 9, further comprising a PCI card disposed in the first pressure zone.

* * * * *